United States Patent
Xu et al.

(10) Patent No.: US 6,623,306 B2
(45) Date of Patent: Sep. 23, 2003

(54) SOLDER MASK CONFIGURATION FOR A PRINTED CIRCUIT BOARD OF A MODULAR JACK

(75) Inventors: Zhenghua Xu, Kunsan (CN); Houg Jun Wang, Kunsan (CN); Qisheng Zheng, KUnsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/142,209

(22) Filed: May 8, 2002

(65) Prior Publication Data

US 2003/0119370 A1 Jun. 26, 2003

(30) Foreign Application Priority Data

Dec. 26, 2001 (TW) ........................................ 90223011 U

(51) Int. Cl.$^7$ ............................................. H01R 24/00
(52) U.S. Cl. ........................ 439/676; 439/83; 439/76.1
(58) Field of Search ......................... 439/676, 83, 876, 439/76.1, 620, 941

(56) References Cited

U.S. PATENT DOCUMENTS

| | | | |
|---|---|---|---|
| 6,010,367 A | * | 1/2000 | Wu .............................. 439/676 |
| 6,171,152 B1 | * | 1/2001 | Kunz ........................... 439/676 |
| 6,174,198 B1 | * | 1/2001 | Wu et al. .................... 439/941 |
| 6,179,668 B1 | * | 1/2001 | Kan ............................. 439/676 |

* cited by examiner

*Primary Examiner*—Gary Paumen
(74) *Attorney, Agent, or Firm*—Wei Te Chung

(57) ABSTRACT

A printed circuit board (23) used in a modular jack (1) includes a plurality of insertion holes (231, 232) defined through an upper side and a lower side thereof. A conductive layer coating (235) coats an inside of each insertion hole and a conductive base ring (236) forms a rim around each end of each hole. A solder mask (230) covers portions of a front and a rear surfaces of the printed circuit board around the insertion holes. The solder mask covers over the base rings and extends a short distance into each insertion hole, thereby increasing a creepage distance between conductive layer coatings of adjacent holes. This protects the printed circuit board from short circuiting.

6 Claims, 5 Drawing Sheets

SOLDER MASK CONFIGURATION FOR A PRINTED CIRCUIT BOARD OF A MODULAR JACK

BACKGROUND OF THE INVENTION

1. Field of the Invention

The present invention relates to a solder mask configuration for a printed circuit board, and particularly to a solder mask configuration for a printed circuit board of a modular jack which improves breakdown voltage performance.

2. Description of Prior Art

During the manufacture of a printed circuit board, a solder mask, which remains on the printed circuit board when in use, is generally used to protect the circuitry and to provide insulation. FIGS. 4 and 5 show a printed circuit board 53 employed in a modular jack (not shown) and engaging with a first terminal insert 51 and a second terminal insert 52, respectively. The printed circuit board 53 has no solder mask thereon and only a conductive metal layer 533 coated on an inside surface of each terminal insertion hole 531 for electrically connecting with a press-fitted end 512 of a first terminal 511 of the first terminal insert 51 or a press-fitted end 522 of a second terminal 521 of the second terminal insert 52. The conductive metal layer 533 forms a base ring 535 on the printed circuit board 53, which is delimited by an outer perimeter 534 thereof. However, a relatively small increase in voltage using this printed circuit board configuration may result in arcing between adjacent base rings 535, because of a relatively short creepage distance L'.

Hence, a printed circuit board having an improved breakdown voltage performance for use in a modular jack, is required.

BRIEF SUMMARY OF THE INVENTION

The object of the present invention is to provide a printed circuit board which has an improved breakdown voltage performance for use in a modular jack.

In order to achieve the above-mentioned object, a printed circuit board in accordance with the present invention includes a plurality of terminal insertion holes defined therethrough. A conductive layer is coated on an inner surface of each terminal insertion hole. A solder mask covers portions of a front and rear surfaces of the printed circuit board between adjacent terminal insertion holes. The mask extends a distance into each terminal insertion hole. As a result, a creepage distance between adjacent holes is increased compared with that of the prior art.

A modular jack using such a printed circuit board comprises an insulating housing, with a first terminal insert and a second terminal insert assembled to the printed circuit board, the assembly of the board with first and second terminal insert being received in the insulating housing. A metal shield encloses the insulating housing. The printed circuit board further has a noise filter soldered thereon for EMI purpose. The first terminal insert comprises an insulative base with a plurality of terminals embedded therein and the second terminal insert comprises an insulative body with a plurality of conductive pins embedded therein. Each terminal and each conductive pin has a press-fitted end for being inserted into and electrically engaging with the corresponding terminal insertion hole.

Other objects, advantages and novel features of the invention will become more apparent from the following detailed description of the present embodiment when taken in conjunction with the accompanying drawings.

DETAILED DESCRIPTION OF THE INVENTION

Figure 1:
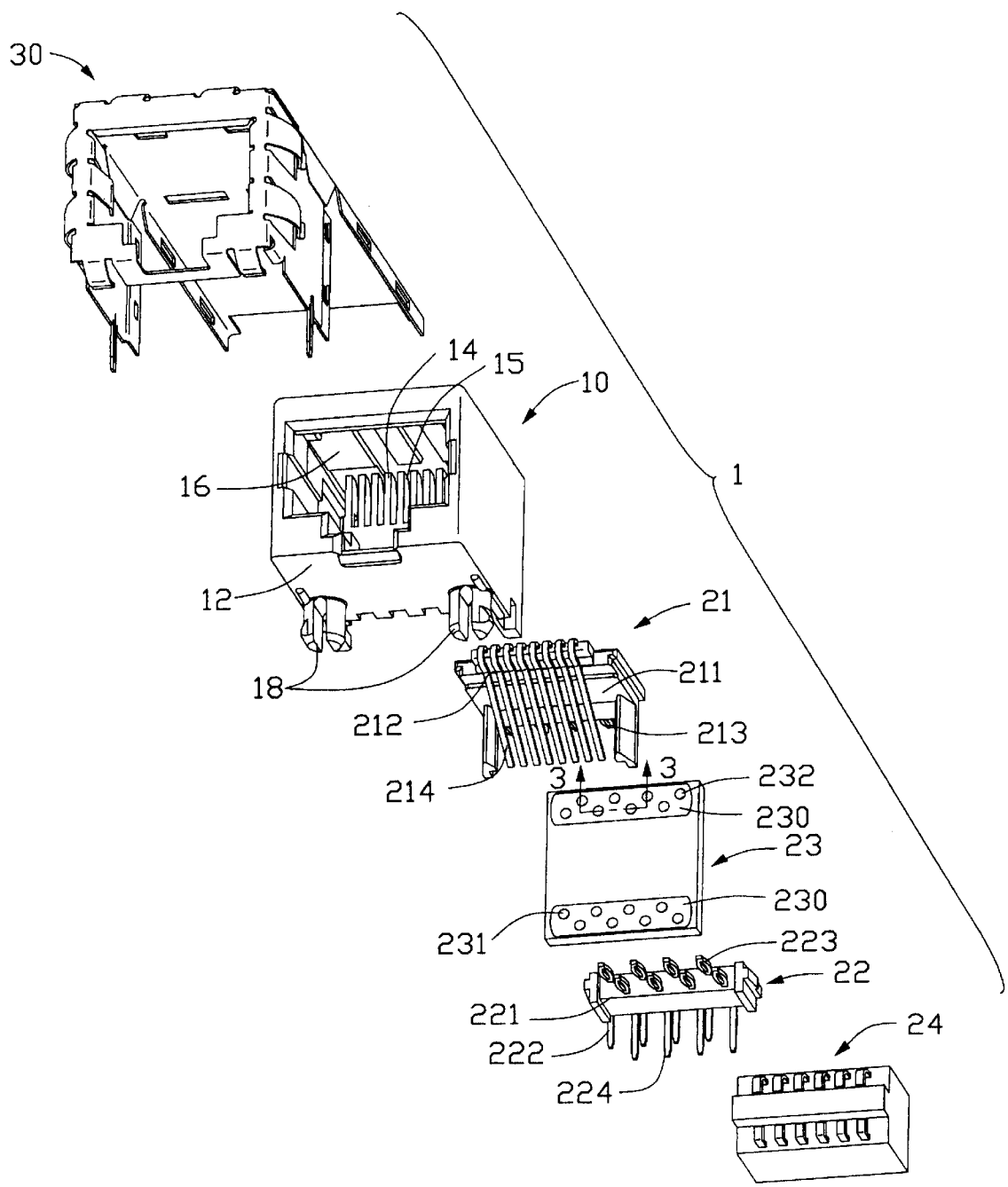
FIG. 1 is an exploded, perspective view of a modular jack in accordance with the present invention.
Figure 2:
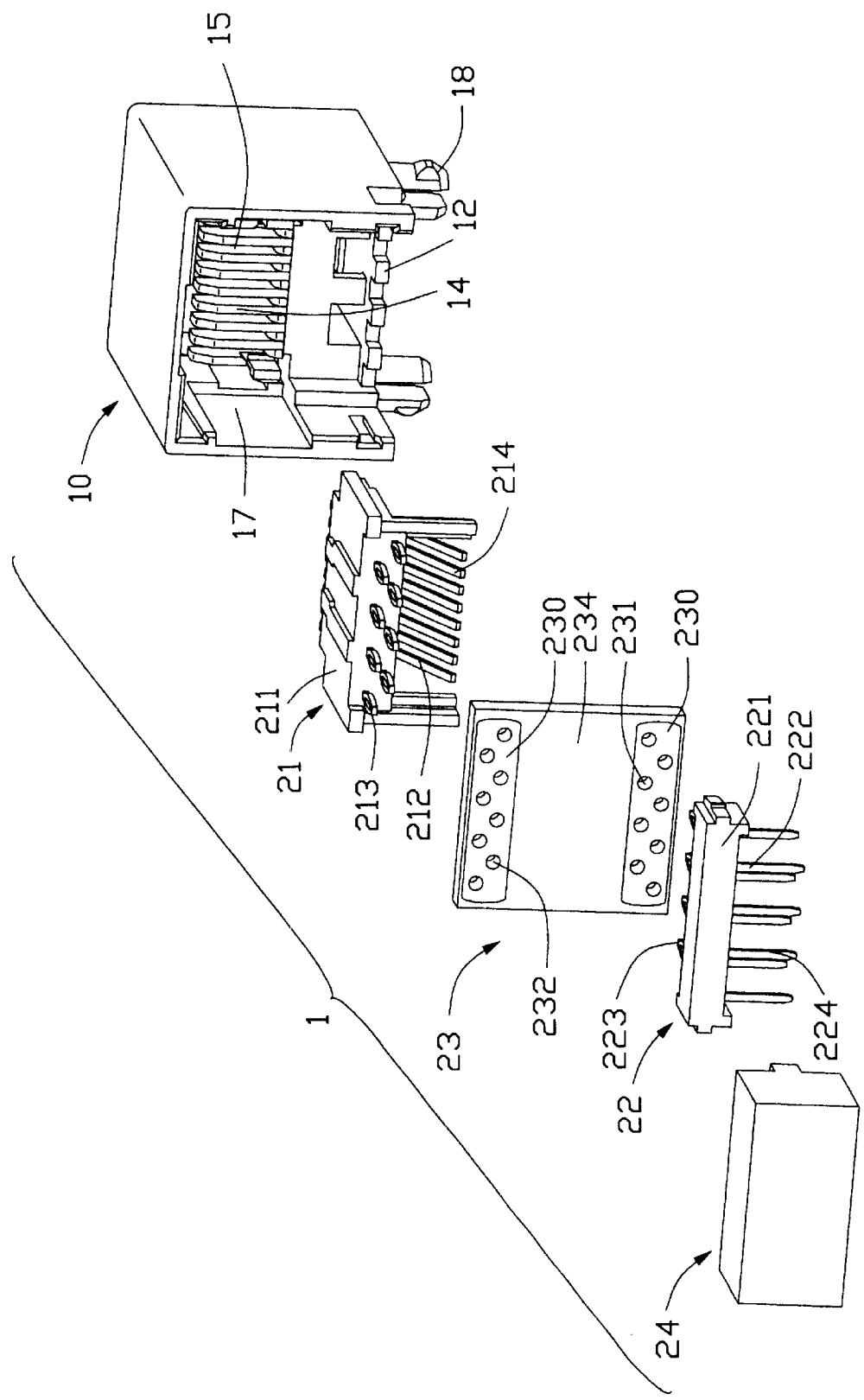
FIG. 2 is a rear aspect exploded, perspective view of the modular jack shown in FIG. 1, without a metal shield.

As shown in FIGS. 1 and 2, a modular jack 1 in accordance with the present invention includes an insulating housing 10 defining a first receiving hole 16 and a second receiving hole 17, a first terminal insert 21 received in the second receiving hole 17 of the insulating housing 10, a printed circuit board 23 incorporating a plurality of electronic devices (not shown), the printed circuit board 23 being attached to the first terminal insert 21, a second terminal insert 22 assembled to the printed circuit board 23, and a noise filter 24 soldered on the printed circuit board 23, and a metal shield 30 enclosing the insulating housing 10.

The insulating housing 10 is formed in a substantially box-shape, and defines the first receiving hole 16 in a front side thereof for receiving a complementary connector (not shown). The second receiving hole 17 is designed in a rear side for receiving the first terminal insert 21 therein. A plurality of middle plates 14 are integrally formed with the insulating housing 10 and separate the first receiving hole 16 from the second receiving hole 17. A plurality of channels 15 are defined between the plurality of middle plates 14. A pair of positioning posts 18 extend downwardly from a bottom wall 12 of the insulating housing 10 for inserting into corresponding holes of a second printed circuit board (not shown) on which the modular jack 1 is mounted.

The first terminal insert 21 comprises a plurality of terminals 212 and an insulating base 211 insert molded around the terminals 212. Each terminal 212 includes a resilient contacting end 214 slantways received in a corresponding channel 15 of the insulating housing 10 and a rearwardly extending press-fitted end 213. The second terminal insert 22 comprises a plurality of conductive pins 222 and an insulating body 221 insert molded around the conductive pins 222. Each conductive pin 222 has a forwardly extending press-fitted portion 223 and a downwardly extending soldering portion 224 for being soldered on the second printed circuit board.

The printed circuit board 23 incorporating a plurality of electronic devices thereon and therein defines a plurality of first insertion holes 232 passing through an upper side thereof for receiving corresponding press-fitted ends 213 of the terminal 212 therein, and a plurality of second insertion holes 231 passing through a lower side thereof and receiving corresponding press-fitted portions 223 of the conductive pins 222 therein.

Figure 3:
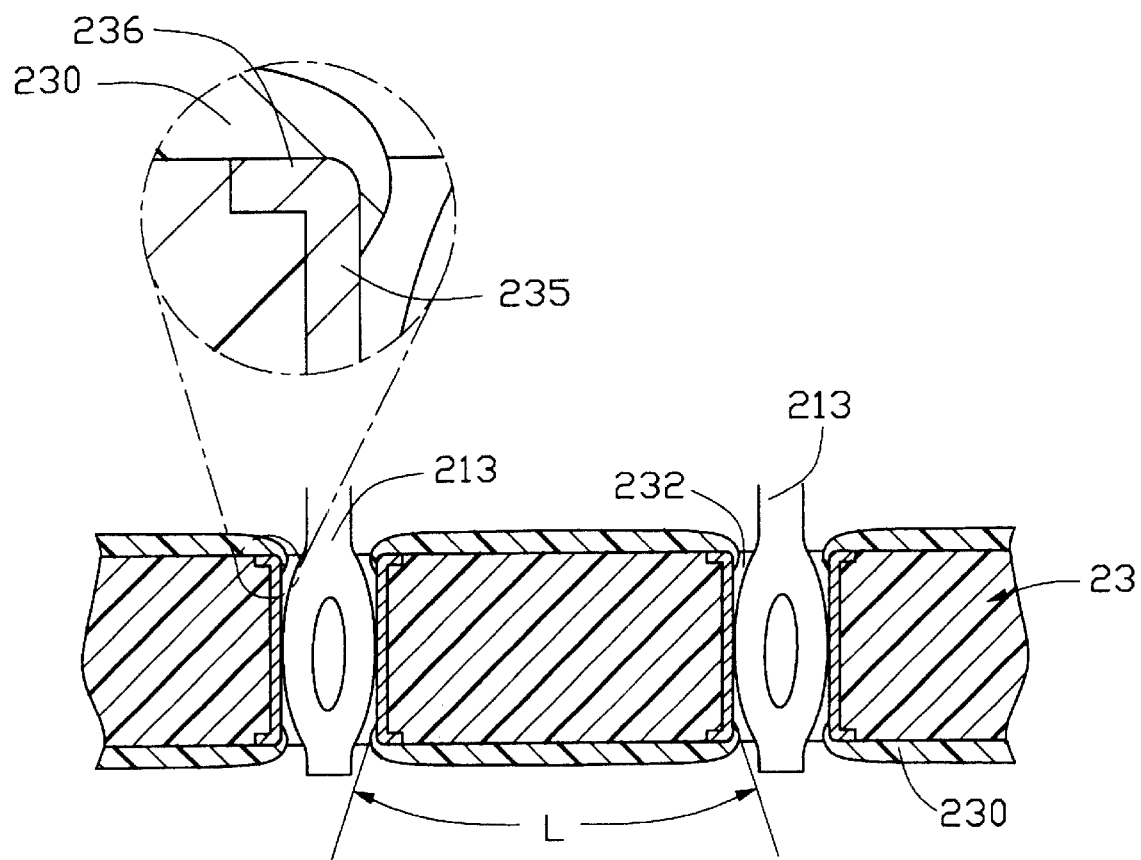
FIG. 3 is an enlarged, cross-sectional view of a printed circuit board shown in FIG. 1 taken along line 3—3 with terminals being received therein.
Figure 4:
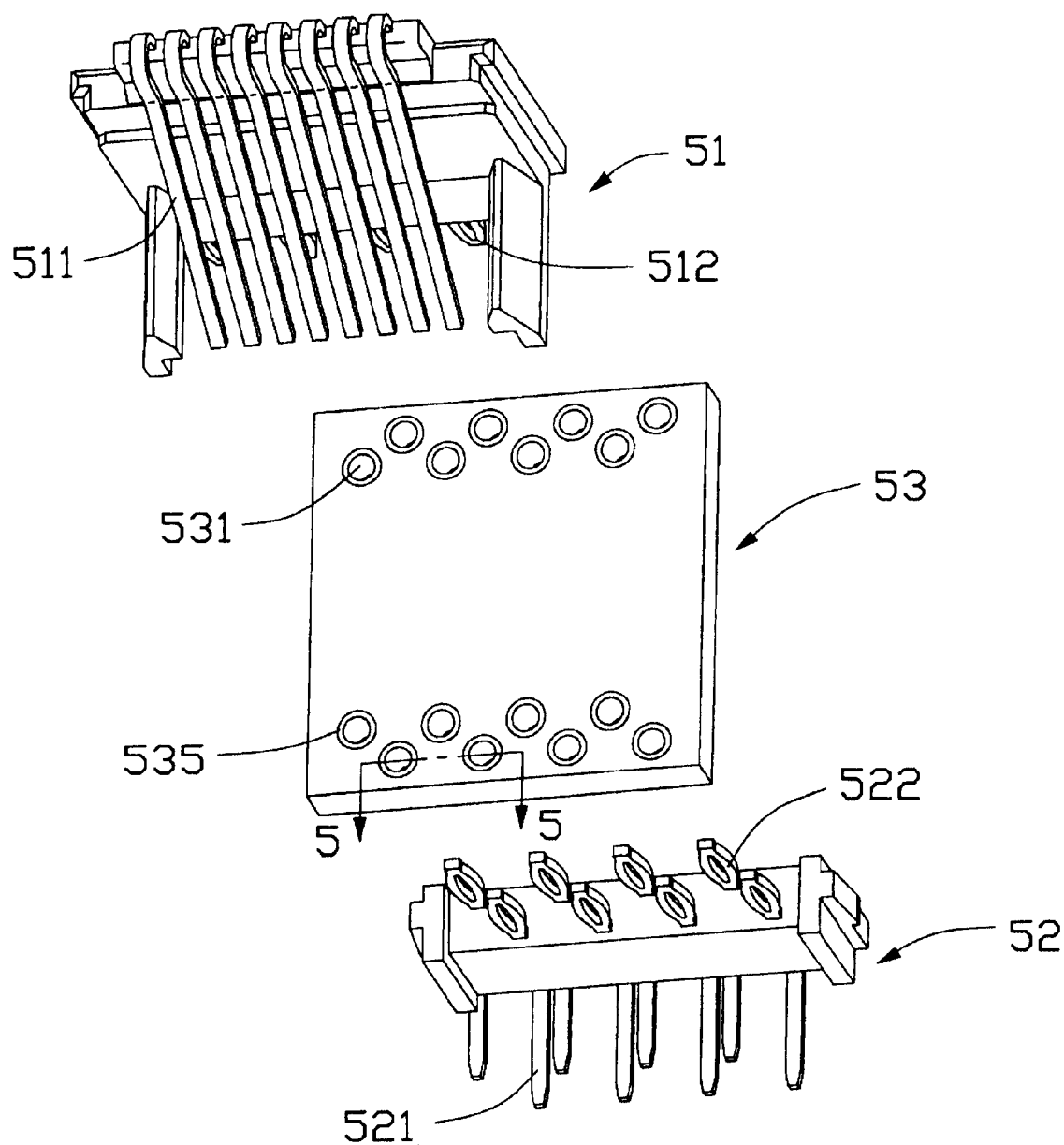
FIG. 4 is an exploded, perspective view of a first terminal insert, a second terminal insert and a printed circuit board of a conventional modular jack.
Figure 5:
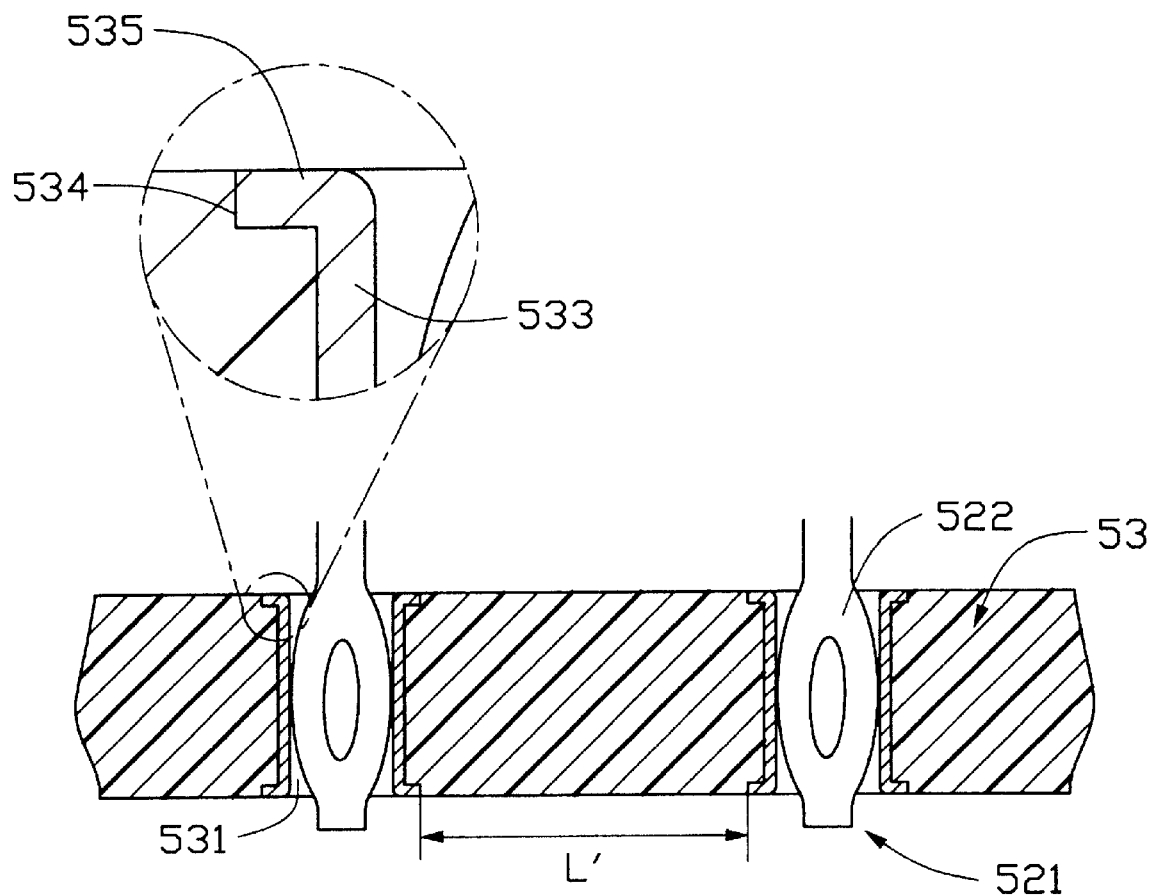
FIG. 5 is a cross-sectional view of the printed circuit board shown in FIG. 4 taken along line 5—5 with terminals being received therein.

Particularly referring to FIG. 3, which illustrates a cross-sectional view of the printed circuit board 23 with press-fitted ends 213 of the terminals 212 inserted thereinto, a conductive layer coating 235 made of a conductive material, such as copper as is known in the art, is coated on an inner surface of each first insertion hole 232 for providing an electrical connection between the printed circuit board 23 and the terminals 212. The conductive layer coating 235 forms a base ring 236 on a front and rear surfaces of the printed circuit board 23. A portion of the front and rear surfaces of the printed circuit board 23 is covered by dielectric solder mask 230. Specifically, the solder mask 230 covers an area around each first insertion hole 232 and between adjacent first insertion holes 232 and extends inwardly into each first insertion hole 232 a tiny distance. The base rings 236 are covered over by the solder mask 230. Each second insertion hole 231 similarly has a conductive layer coating (not shown) and base rings (not shown), and a solder mask 230 is similarly applied over an area of the front and rear surfaces of the printed circuit board 23 in the vicinity of the second insertion holes 231. The solder mask 230 similarly covers over the base rings of and extends a tiny distance into each second insertion hole 231. Consequently, the solder mask portion 230 increases a creepage distance L between adjacent insertion holes 231, 232 over which an electrical current have to pass to short circuit two holes 231, 232, thereby improving the voltage breakdown performance.

In assembly, referring to FIGS. 1 and 2, the noise filter 24 is soldered on the rear surface 234 of the printed circuit board 23. The first terminal insert 21 is attached on the upper side of the front surface (not labeled) of the printed circuit board 23, with the press-fitted ends 213 of the terminals 212 being inserted into and being received in the corresponding first insertion holes 232. At the same time, the second terminal insert 22 is attached to the lower side of the rear surface of the printed circuit board 23, with the press-fitted portions 223 of the conductive pins 222 being inserted into and being received in corresponding second insertion holes 231. The printed circuit board 23 together with the first and second terminal inserts 21, 22 is assembled in the second receiving hole 17 of the insulating housing 10, with the resilient contacting ends 214 of the terminals 212 being exposed in the corresponding channels 15 for electrical connection with contacts of the complementary connector. Finally, the metal shield 30 is attached on the insulating housing 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A modular jack for mating with a complementary connector comprising:
    an insulating housing defining a first receiving hole at a front thereof for receiving a complementary connector and a second receiving hole at a rear;
    a first terminal insert received in the second receiving hole, the first terminal insert having a plurality of terminals embedded therein, each terminal comprising an inclined contacting end extending into the first receiving hole, and a backwardly extending press-fitted end extending into the second receiving hole;
    a printed circuit board received in the second receiving hole and defining a plurality of insertion holes therethrough, each insertion hole having a conductive layer coating on an inner surface thereof, the printed circuit board comprising a solder mask covering a portion of at least a surface thereof around the insertion holes, and extending radially into each insertion hole a tiny distance to increase a creepage distance between conductive layer coatings of adjacent insertion holes, the press-fitted ends of the terminals being press-fitted in corresponding insertion holes; and
    a second terminal insert received in the second receiving hole of the insulating housing, the second terminal insert having a plurality of conductive pins embedded therein, each conductive pin comprising a downwardly extending soldering portion and a forwardly extending press-fitted portion engaging with a corresponding insertion hole.

2. The modular jack as described in claim 1, further comprising a shield enclosing the insulating housing.

3. The modular jack as described in claim 1, wherein the plurality of insertion holes are defined respectively through an upper side and a lower side of the printed circuit board for respectively engaging with the terminals of the first terminal insert and the conductive pins of the second terminal insert.

4. The modular jack as described in claim 1, further comprising a noise filter attached on the printed circuit board.

5. The modular jack as described in claim 1, wherein the insulating housing has a plurality of middle plates integrally formed therewith separating the first receiving hole from the second receiving hole and defining a plurality of channels between the middle plates for receiving the inclined contacting ends of the terminals of the first terminal insert for electrical connection with the complementary connector.

6. The modular jack as described in claim 1, wherein the conductive layer coatings of the insertion holes each forms base rings on opposite surfaces of the printed circuit board and the base rings are covered over by the solder mask.

* * * * *